United States Patent
Ishikawa et al.

(10) Patent No.: US 7,447,484 B2
(45) Date of Patent: Nov. 4, 2008

(54) TIMING CONTROLLER AND TIMING CONTROL METHOD

(75) Inventors: Hiroyoshi Ishikawa, Kawasaki (JP);
Kazuo Nagatani, Kawasaki (JP);
Hajime Hamada, Kawasaki (JP);
Nobukazu Fudaba, Kawasaki (JP);
Tokuro Kubo, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 397 days.

(21) Appl. No.: 11/387,811

(22) Filed: Mar. 24, 2006

(65) Prior Publication Data
US 2007/0159256 A1    Jul. 12, 2007

(30) Foreign Application Priority Data
Dec. 27, 2005   (JP)   ............................. 2005-375677

(51) Int. Cl.
    *H04B 1/04*  (2006.01)
(52) U.S. Cl. ........................................ 455/126; 330/151
(58) Field of Classification Search ........................ None
    See application file for complete search history.

(56) References Cited

U.S. PATENT DOCUMENTS 7,342,446 B2 *   3/2008  Blodgett ..................... 330/151
7,379,715 B2 *   5/2008  Udagawa et al. ............ 455/126
2005/0079835 A1  4/2005  Shinichiro et al.

FOREIGN PATENT DOCUMENTS

| EP | 1 598 943 A1 | 11/2005 |
| FR | 2 837 639 A1 | 9/2003 |
| JP | 3-174810 | 7/1991 |

* cited by examiner

*Primary Examiner*—Thanh C Le
(74) *Attorney, Agent, or Firm*—Hanify & King, P.C.

(57) ABSTRACT

A timing controller is disclosed that includes: an amplifier part configured to amplify a first input signal in accordance with a control voltage, the first input signal being one of a transmission signal and a signal of a fixed value; a detector part configured to detect envelope information from the output signal of the amplifier part; a controller part configured to determine a delay difference from the transmission signal and the envelope information and transmit a timing control signal based on the delay difference; and a delay corrector part configured to correct the delay of a second input signal in accordance with the timing control signal, the second input signal being one of the transmission signal and a signal of a fixed value. One of the first and second input signals employs the corresponding signal of the fixed value in the case of correcting the delay.

13 Claims, 12 Drawing Sheets

TIMING CONTROLLER AND TIMING CONTROL METHOD

BACKGROUND OF THE INVENTION

1. Field of the Invention

The present invention relates generally to the technical field of an amplifier employed in high frequency bands, and more particularly to a device and method for controlling the timing between the input signal and the voltage control signal of the amplifier.

2. Description of the Related Art

In a linear transmitter, a signal to be transmitted (transmission signal) is linearly amplified and transmitted. In order to linearly amplify signals of various (power) levels ranging from low to high, it is necessary to supply power to the amplifier based on a high level signal. However, constant application of high supply voltage to the amplifier has the problem of significant reduction in amplification efficiency in the case of amplifying a small (low power) signal. This is disadvantageous in particular to simple mobile communications devices and devices using a small-size battery. In order to cope with such a problem, the technique of suitably switching supply voltage to be applied to an amplifier in accordance with the level of a signal to be amplified is proposed (see, for example, Japanese Laid-Open Patent Application No. 3-174810).

FIG. 1 is a diagram for illustrating such amplification control. A transmission signal is input to an amplifier 101. The amplifier 101 amplifies the input signal in accordance with a voltage control signal v, and outputs an amplified output signal. The voltage control signal v varies in accordance with the amplitude level of the transmission signal, and is derived from an envelope detector 102. A signal indicating the level of amplitude may be referred to as "envelope signal."

FIG. 2 is a graph showing exemplary input/output characteristics of an amplifier. The horizontal axis represents the voltage level of an input signal, and the vertical axis represents the voltage level of an output signal. In FIG. 2, three sets of input/output characteristics are indicated by respective lines a, b, and c. The line a shows the case where the input/output characteristic shows linearity at or below an input voltage a1 and is non-linear above the input voltage a1. The line b shows the case where the input/output characteristic shows linearity at or below an input voltage a2 and is non-linear above the input voltage a2. The line c shows the case where the input/output characteristic shows linearity at or below an input voltage a3 and is non-linear above the input voltage a3.

The envelope detector 102 of FIG. 1 measures the level of the transmission signal. If the measured level is low, the envelope detector 102 sets the voltage control signal v for the amplifier 101 to v1 (v=v1). As a result, the amplifier 101 shows an input/output characteristic as indicated by a in FIG. 2, and small signals having a level lower than or equal to v1 are linearly amplified. On the other hand, if the measured level of the transmission signal is high, the envelope detector 102 sets the voltage control signal v for the amplifier 101 to v3 (v=v3). As a result, the amplifier 101 shows an input/output characteristic as indicated by c in FIG. 2, and large signals are also linearly amplified. Thus, by suitably changing the supply voltage of the amplifier 101 in accordance with the input signal, it is possible to obtain a linearly amplified output signal with high efficiency. Practically, voltages of more than these three levels v1, v2, and v3 are applied continuously or step by step to the amplifier 101.

According to the above-described method, supply voltage is suitably changed in accordance with the level of the input signal. Accordingly, the input signal and the voltage control signal v should be timed appropriately with each other. On the other hand, the properties of devices (the properties of analog devices in particular) vary to some extent because of the material characteristics of the devices, manufacturing processes, and manufacturing environment. As a result, there is concern that the transmission signal (input signal) and the voltage control signal v are slightly out of phase with each other.

FIG. 3 shows the input signal, output signal, and voltage control signal of an amplifier. The horizontal axis represents time, and the vertical axis represents an amplitude level. FIG. 3 shows the case where the input signal and the voltage control signal, which should be in phase with each other, are out of phase with each other by a time τ, so that the waveform of the output signal is different from what it should be. For example, in the period indicated by $T_1$, the fed voltage control signal is greater than the input signal. In this case, the input signal itself may be linearly amplified. However, since a voltage higher than the necessary supply voltage is applied to the amplifier, the efficiency of amplification is reduced. In the period indicated by $T_2$, a signal of a level exceeding the highest voltage that can be linearly amplified by the amplifier is input to the amplifier. Accordingly, the output signal of the amplifier deviates from the linear amplification of the input signal, and is non-linearly amplified. Further, there is also concern that an unintended abrupt change forced on the output signal may result in the occurrence of an unnecessary frequency component. Thus, if the input signal and the voltage control signal are not appropriately timed with each other, the degradation of a signal and the radiation of unnecessary waves are caused. This problem of timing offset occurs product by product. Accordingly, its compensation should also be performed product by product. However, a method for automatically performing such compensation or control with efficiency has not been discovered, while performing it manually is time-consuming and unsuitable for controlling many products.

SUMMARY OF THE INVENTION

According to one embodiment of the present invention, there are provided a device and a method for controlling the timing between the input signal and the voltage control signal of an amplifier in which the above-described disadvantage is eliminated.

According to one embodiment of the present invention, there are provided a device and a method for controlling the timing between the input signal and the voltage control signal of an amplifier in a linear transmitter that switches the supply voltage of the amplifier in accordance with the level of the input signal and outputs an output signal with little distortion with high amplification efficiency.

According to one embodiment of the present invention, there is provided a timing controller including: an amplifier part configured to amplify a first input signal in accordance with a control voltage, the first input signal being one of a transmission signal and a signal of a fixed value; a detector part configured to detect envelope information from an output signal of the amplifier part; a controller part configured to determine a delay difference from the transmission signal and the envelope information and transmit a timing control signal based on the delay difference; and a delay corrector part configured to correct a delay of a second input signal in accordance with the timing control signal, the second input signal being one of the transmission signal and a signal of a fixed value, wherein one of the first and second input signals employs the corresponding signal of the fixed value in a case of correcting the delay.

According to one embodiment of the present invention, there is provided a timing controller including: an amplifier part configured to amplify a transmission signal while controlling supply voltage to a power amplifier; a generator part configured to generate a voltage control signal from envelope information of the transmission signal; a main signal switch configured to select one of a transmission signal and a signal representing a fixed value, the main signal switch being provided in a main signal channel; a control signal switch configured to select one of the transmission signal and a signal representing a fixed value, the control signal switch being provided in a control channel; a delay detector part configured to detect a delay difference between the main signal channel and the control channel based on a feedback signal from the amplifier part; and a controller part configured to control a channel delay of at least one of the main signal channel and the control channel so as to cancel the delay difference, wherein each of the main signal switch and the control signal switch selects the transmission signal in a non-control mode, and one of the main signal switch and the control signal switch selects the transmission signal and another one of the main signal switch and the control signal switch selects the corresponding signal of the fixed value in a control mode.

According to one embodiment of the present invention, there is provided a timing control method including the steps of: (a) amplifying a first input signal in accordance with a control voltage, the first input signal being one of a transmission signal and a signal of a fixed value; (b) detecting envelope information from the amplified signal of step (a); (c) determining a delay difference from the transmission signal and the envelope information and transmitting a timing control signal based on the delay difference; and (d) correcting a delay of a second input signal in accordance with the timing control signal, the second input signal being one of the transmission signal and a signal of a fixed value, wherein one of the first and second input signals employs the corresponding signal of the fixed value in a case of correcting the delay.

According to one embodiment of the present invention, there is provided a timing control method including the steps of: (a) providing one of a transmission signal and a signal representing a fixed value in a main signal channel and providing another one of the transmission signal and the signal representing the fixed value in a control channel; (b) amplifying the one of the transmission signal and the signal representing the fixed value from the main signal channel in accordance with a voltage control signal from the control channel; (c) providing the other one of the transmission signal and the signal representing the fixed value in the main signal channel and providing the one of the transmission signal and the signal representing the fixed value in the control channel; (d) amplifying the other one of the transmission signal and the signal representing the fixed value from the main signal channel in accordance with the voltage control signal from the control channel; (e) determining a delay difference between the main signal channel and the control channel based on the amplified one of the transmission signal and the signal representing the fixed value from the main signal channel and the amplified other one of the transmission signal and the signal representing the fixed value from the main signal channel; and (f) controlling a channel delay of at least one of the main signal channel and the control channel so as to cancel the delay difference therebetween.

According to one aspect of the present invention, it is possible to suitably control the timing between the input signal and the voltage control signal of an amplifier with ease in a linear transmitter that switches the supply voltage of the amplifier in accordance with the level of the input signal and outputs an output signal with little distortion with high amplification efficiency.

BRIEF DESCRIPTION OF THE DRAWINGS

Other objects, features and advantages of the present invention will become more apparent from the following detailed description when read in conjunction with the accompanying drawings, in which.

DETAILED DESCRIPTION OF THE PREFERRED EMBODIMENTS

A description is given below, with reference to the accompanying drawings, of embodiments of the present invention.

First Embodiment

Figure 4:
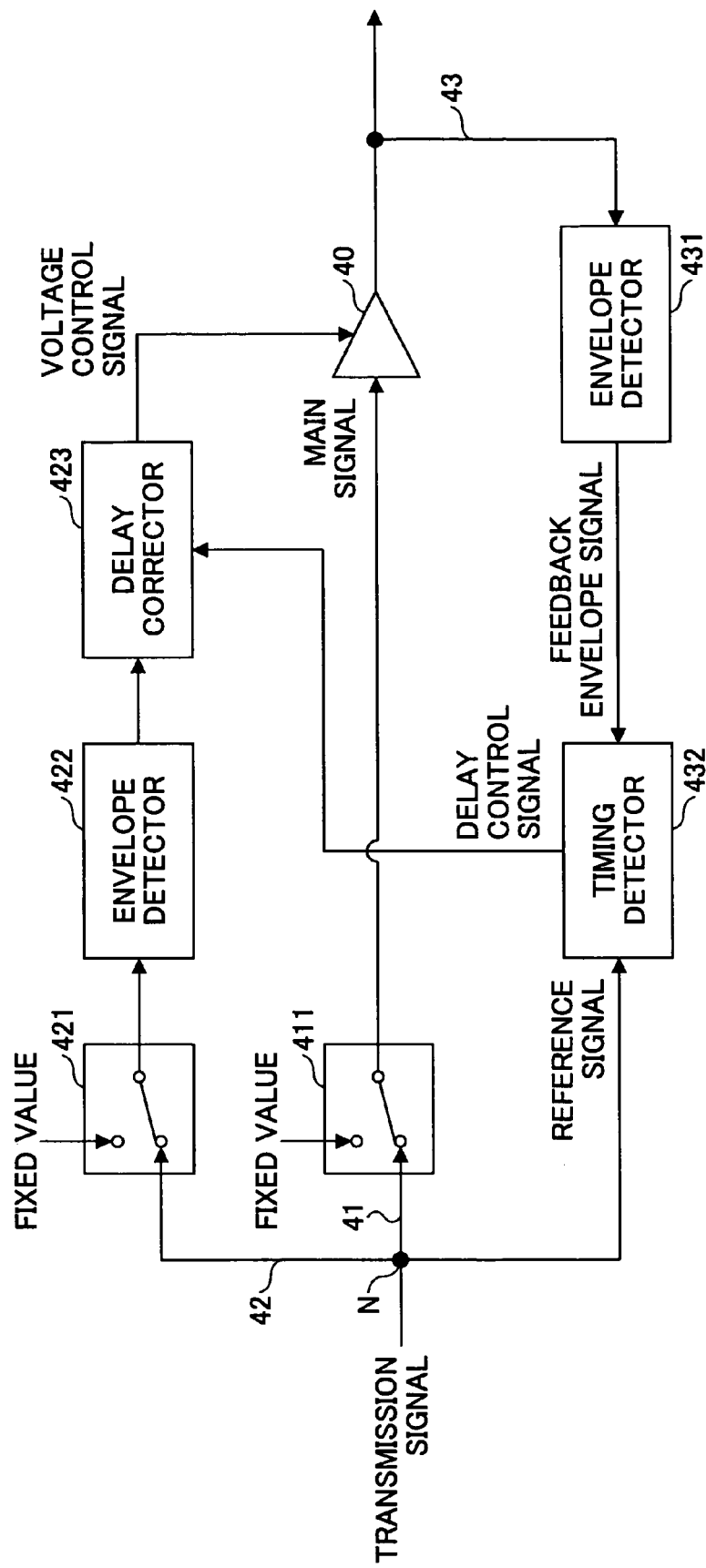
FIG. 4 is a block diagram showing part of a linear transmitter according to a first embodiment of the present invention.

FIG. 4 is a block diagram showing part of a linear transmitter according to a first embodiment of the present invention.

Referring to FIG. 4, the linear transmitter includes an amplifier 40, a main signal channel 41 provided on the input side of the amplifier 40, a control signal channel 42 provided on the control signal side of the amplifier 40, and a feedback channel 43 provided on the output side of the amplifier 40. In the main signal channel 41, a switch 411 is provided between a node N to which a signal to be transmitted (a transmission signal) is fed and the input port of the amplifier 40. In the control signal channel 42, a switch 421 connected to the node N and an envelope detector part 422 connected to the output of the switch 421 are provided, and a delay corrector part 423 is provided between the output of the envelope detector part 422 and the control port of the amplifier 40. In the feedback channel 43, an envelope detector part 431 connected to the output port of the amplifier 40 is provided, and a timing detector part 432 is provided between the output of the envelope detector part 431 and the node N. An instruction signal (a delay control signal) from the timing detector part 432 is fed to the delay corrector part 423. In FIG. 4, elements other than those described above are not shown for simplification of description.

The amplifier 40 is a power amplifier that amplifies a signal input thereto as a main signal in accordance with a voltage control signal, and outputs the amplified signal.

The switch 411 in the main signal channel 41 selects either the transmission signal (input signal) or a signal representing a fixed value, and feeds the selected signal to the input port of the amplifier 40. The transmission signal may be either an analog signal or a digital signal. That is, the transmission signal or the signal representing the fixed value does not have to be fed directly to the input port of the amplifier 40. Elements such as a digital-to-analog converter part, a frequency converter part, and a filter part may be provided in the main signal channel as required. By way of example, the signal representing the fixed value is provided as a direct-current signal. The fixed value may be any appropriate value. Desirably, however, the fixed value is greater than any transmission signal level as described below.

Like the switch 411, the switch 421 in the control signal channel 42 also selects either the transmission signal or the signal representing the fixed value. The switch 421 feeds the selected signal to the envelope detector part 422. In a non-control mode, both switches 411 and 421 select the transmission signal. Meanwhile, in a control mode, one of the switches 411 and 421 selects the transmission signal, and the other one selects the signal representing the fixed value. The fixed value may be different between the switches 411 and 421.

Figure 1:
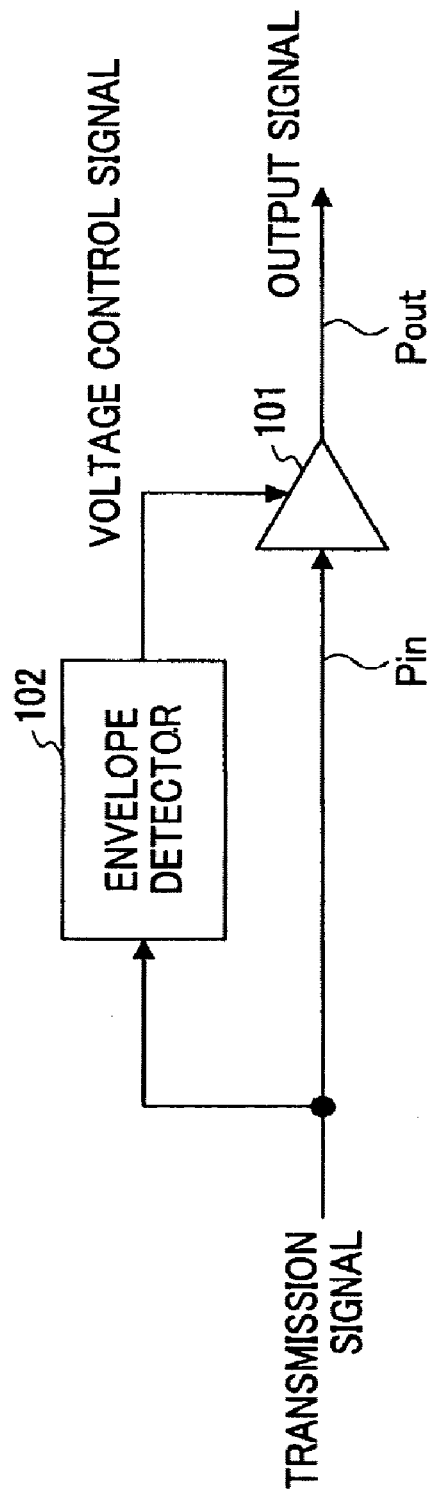
FIG. 1 is a diagram for illustrating a conventional amplification control method.
Figure 2:
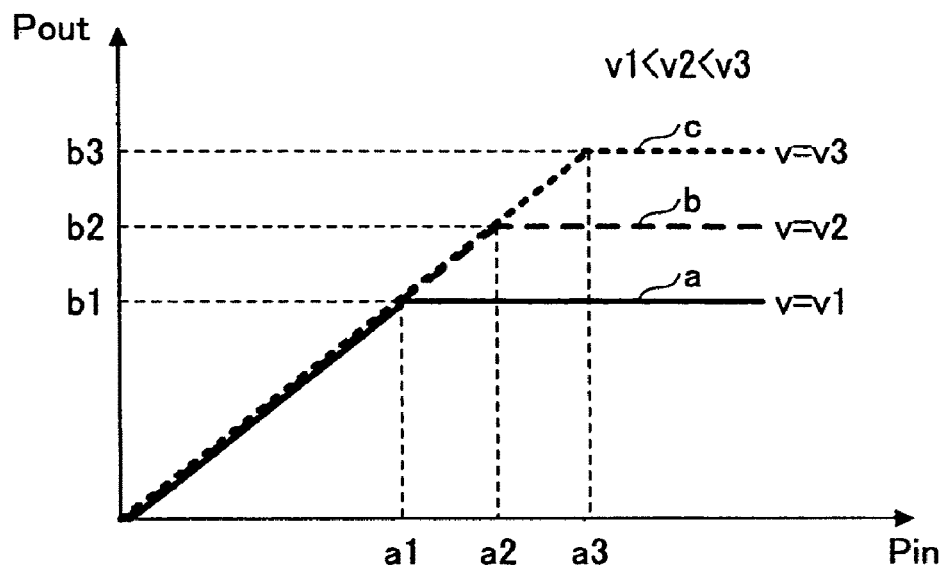
FIG. 2 is a graph showing exemplary input/output characteristics of an amplifier.
Figure 3:
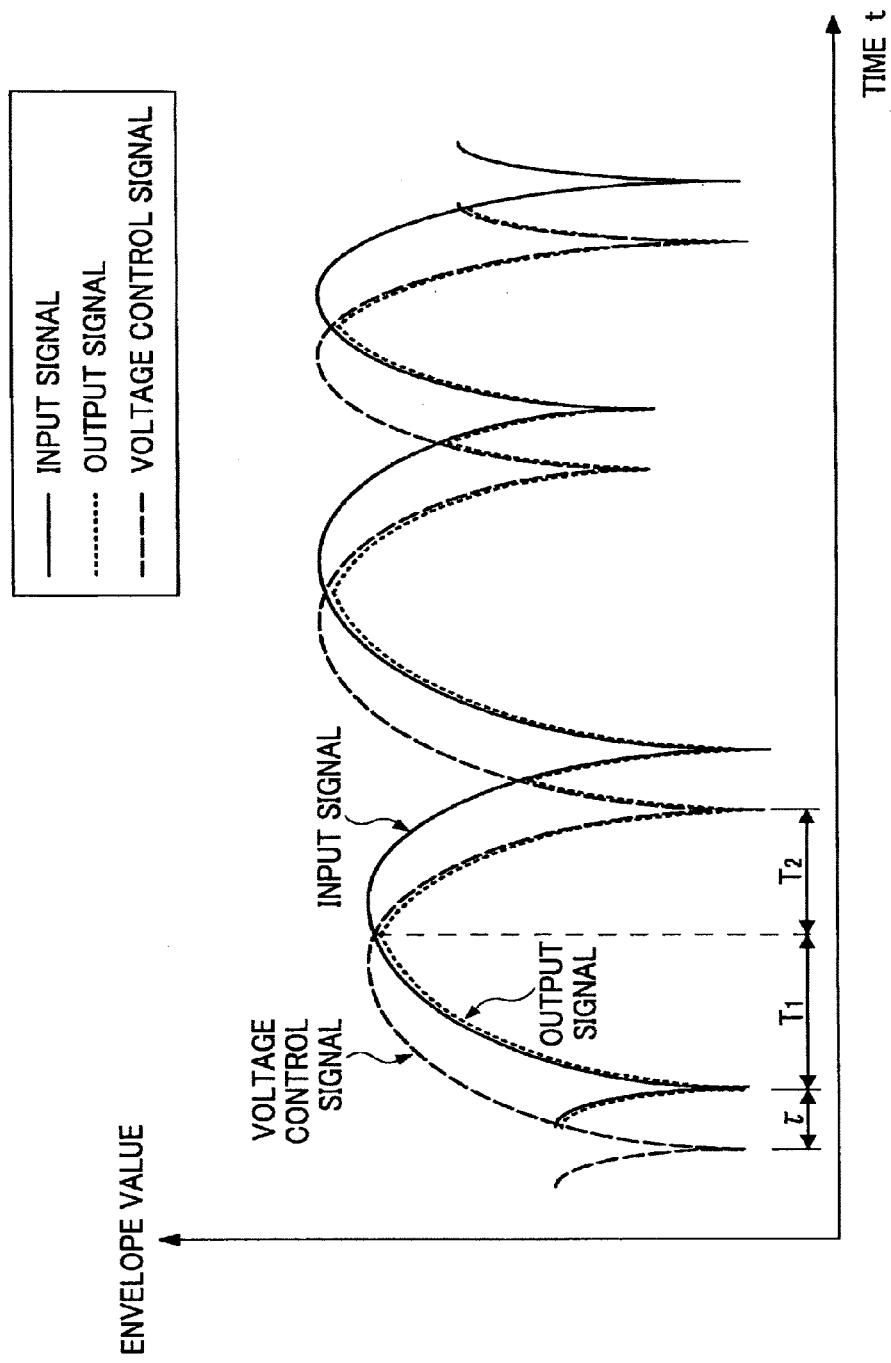
FIG. 3 is a graph showing an input signal, an output signal, and a control signal.

The envelope detector part 422 calculates or measures the amplitude level of a signal input thereto. If the signal has been subjected to quadrature modulation, the envelope detector part 422 calculates the magnitude of the signal by determining the root sum square of its in phase component and quadrature component. A signal indicating the level of amplitude is also referred to as "envelope signal." The envelope detector part 422 generates the voltage control signal to be fed to the amplifier 40 in accordance with the amplitude level of the signal input thereto. This signal corresponds to the voltage control signal v of FIG. 2.

The delay corrector part 423 controls the timing of the voltage control signal output from the envelope detector part 422 by advancing or delaying the voltage control signal on a time axis in accordance with an instruction from the timing detector part 432, and feeds the timing-controlled voltage control signal to the amplifier 40.

Like the envelope detector part 422, the envelope detector part 431 in the feedback channel 43 also measures the amplitude level of a signal input thereto. The measured amplitude level is provided to the timing detector part 432.

The timing detector part 432 determines the difference in delay between the main signal channel 41 and the control signal channel 42 (channel delay difference) based on a feedback signal from the envelope detector part 431, and generates the instruction signal to be fed to the delay corrector part 423. The instruction signal represents a delay in the delay corrector part 423 so as to cancel the channel delay difference.

Figure 5:
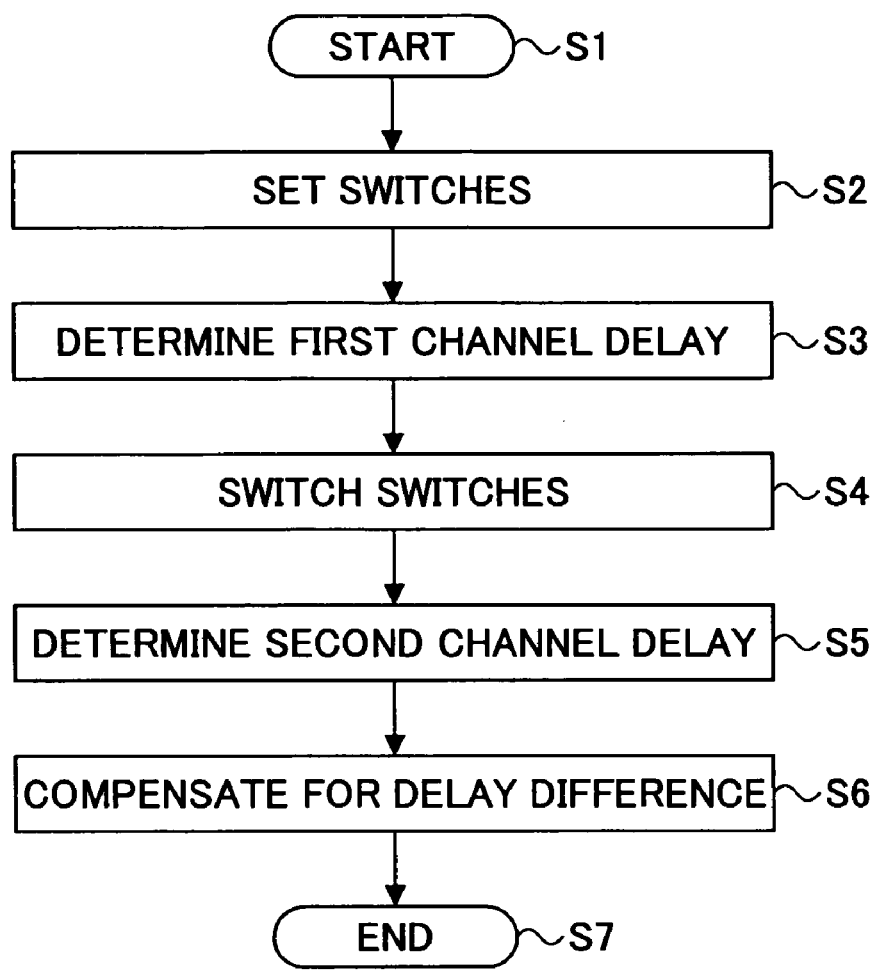
FIG. 5 is a flowchart showing a timing control method according to the first embodiment of the present invention.
Figure 6:
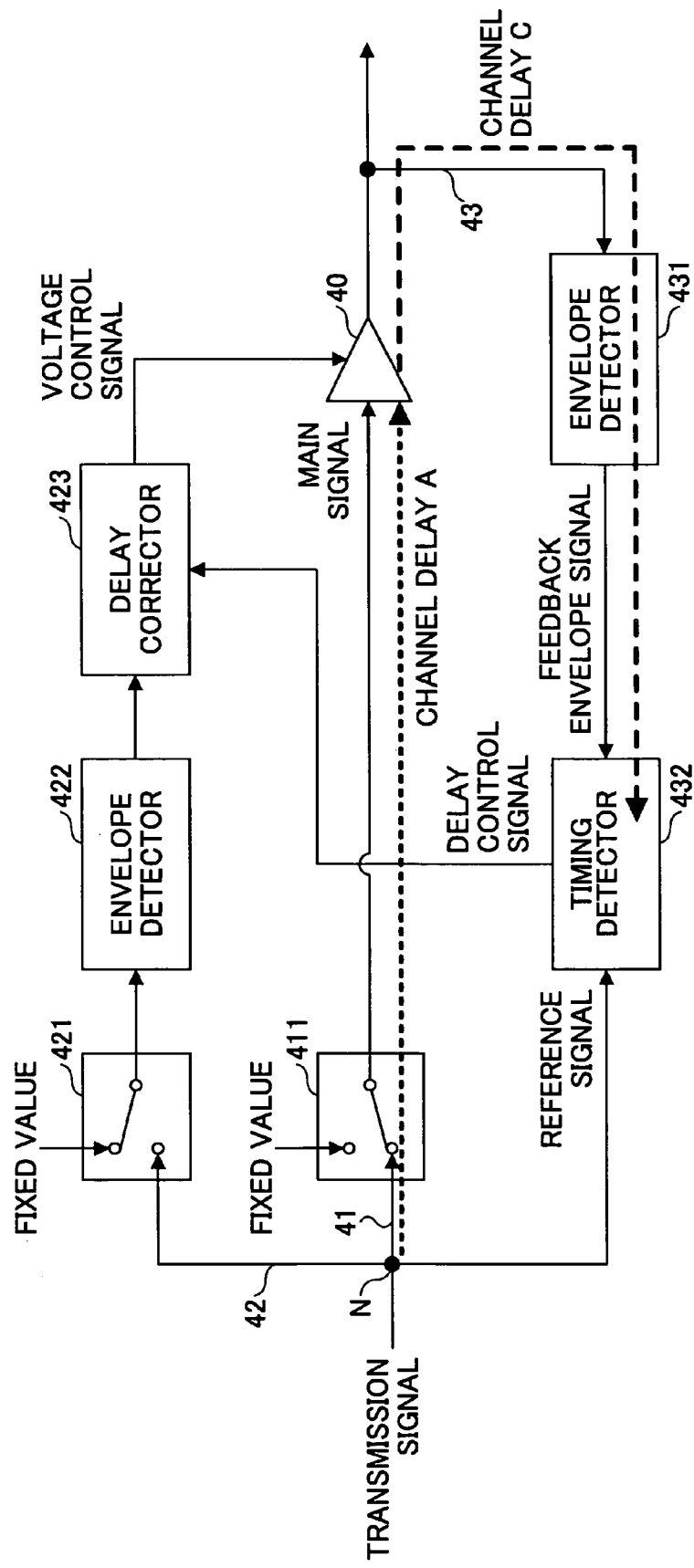
FIG. 6 is a block diagram showing measurement of a first channel delay according to the first embodiment of the present invention.

FIG. 5 is a flowchart showing a timing control method according to the first embodiment of the present invention. In step S1, the flow starts, and in step S2, the switches 411 and 421 are suitably set. According to this embodiment, the switches 411 and 421 are set at this stage so that the switch 411 of the main signal channel 41 selects the transmission signal and the switch 421 of the control signal channel 42 selects the fixed value as shown in FIG. 6.

In step S3, a first channel delay is measured. It is assumed that a delay in the delay corrector part 423 is zero (that is, it is assumed that no timing control is performed). It is assumed that the fixed value is set to indicate a large value. In this case, the envelope detector part 422 provides the amplifier 40 with a voltage control signal corresponding to a high amplitude level. As a result, the amplifier 40 linearly amplifies a signal input thereto, and outputs the amplified signal. Even if the level of the input signal is high, the input signal is directly amplified linearly and output if the voltage control signal is set to be sufficiently large. The timing detector part 432 can determine the first channel delay, or the delay of the channel from the node N to the timing detector part 432 via the amplifier 40 and the feedback channel 43, by checking the timing of the transmission signal (as a reference signal) obtained from the node N and the timing of the feedback signal. In FIG. 6, the first channel delay is shown as a channel delay A and a channel delay C. For simplification, the delay of the channel directly from the node N to the timing detector part 432 is assumed to be zero. This assumption does not deprive the present invention of its generality. This is because even if the delay is not zero, it is sufficient to consider a certain offset included in the channel delay.

Figure 7:
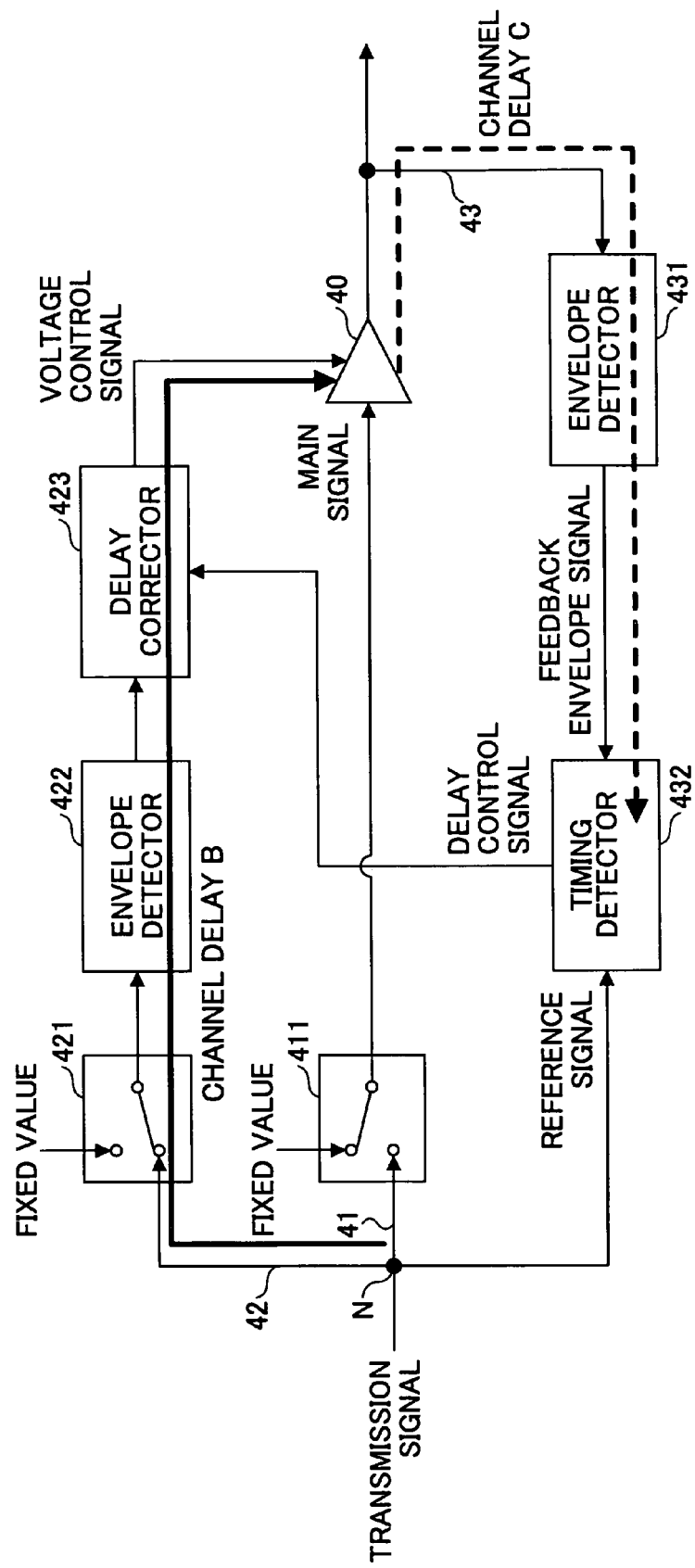
FIG. 7 is a block diagram showing measurement of a second channel delay according to the first embodiment of the present invention.

In step S4, the switches 411 and 421 are suitably switched. According to this embodiment, the switches 411 and 421 are set so that the switch 411 of the main signal channel 41 selects the fixed value and the switch 421 of the control signal channel 42 selects the transmission signal as shown in FIG. 7.

In step S5, a second channel delay is measured. The switch 411 of the main signal channel 41 selects the fixed value that is a large value, and the selected fixed value is input to the amplifier 40. On the other hand, since the switch 421 selects the transmission signal, the voltage control signal varies in accordance with the transmission signal. The amplifier 40 amplifies a signal input thereto in accordance with the voltage control signal. Accordingly, if the signal level of the input signal is high, a signal of a large value is output if the voltage control signal also shows a large value. However, even if the level of the signal input to the amplifier 40 is high, only a signal restricted to a small value is output if the voltage control signal is small in value. In the situation shown in FIG. 7, a large fixed value is input to the amplifier 40. Therefore, the output signal changes in accordance with a change in the voltage control signal. Accordingly, the timing detector part 432 can determine the second channel delay, or the delay of the channel from the node N to the timing detector part 432 via the envelope detector part 422, the amplifier 40, and the feedback channel 43, by checking the timing of the transmission signal obtained directly from the node N and the timing of the feedback signal. In FIG. 7, the second channel delay is shown as a channel delay B and the channel delay C.

Figure 8:
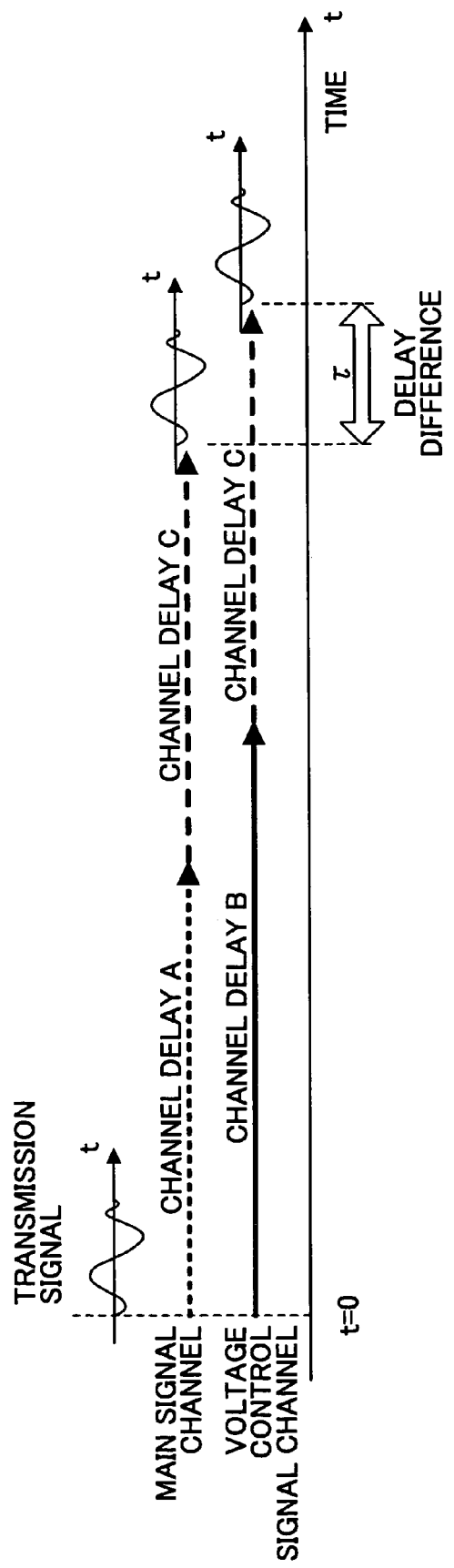
FIG. 8 is a diagram showing the relationship between the first channel delay and the second channel delay according to the first embodiment of the present invention.

In step S6, the difference in delay between the two channels, or a delay difference τ, is determined by determining the difference between the first and second channel delays. FIG. 8 shows the relationship between the first channel delay (the channel delay A and the channel delay C) and the second channel delay (the channel delay B and the channel delay C). The timing detector part 432 determines the contents of the instruction signal so that the delay difference T thus determined is compensated for, and communicates the determined contents to the delay corrector part 423. The delay corrector part 423 performs settings so that the reported delay is provided to the corresponding channel. Then, in step S7, the timing control procedure ends. Thereafter, each of the switches 411 and 421 is set so as to select the transmission signal, and the transmitter enters a normal operation mode (non-control mode).

For convenience of description, the second channel delay (the channel delay B and the channel delay C) is measured after the first channel delay (the channel delay A and the channel delay C) is measured. However, the first and second channel delays may be measured in the opposite order.

Further, as an alternative, the delay corrector part 423 may be provided between the switch 411 and the amplifier 40 so as to control the delay of the channel from the node N to the timing detector part 432 via the amplifier 40 and the feedback channel 43, or be provided in each of the two channels.

Figure 9:
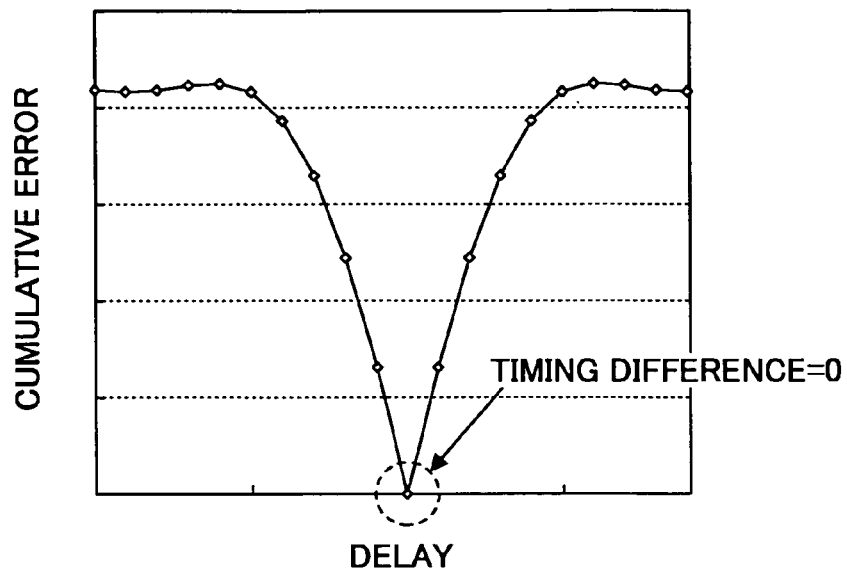
FIG. 9 is a graph showing the relationship between the difference between a cumulative error and a delay according to the first embodiment of the present invention.

The timing detector part 432 may use various methods to determine the difference between the first and second channel delays. For example, the accumulation of errors (cumulative error) between the transmission signal obtained directly from the node N and the feedback signal may be employed. In the case where the timing detector part 432 processes digital signals as in this embodiment, the sum of a predetermined number of data samples each representing error is employed. An analog signal may be used in another embodiment. In this case, a quantity representing error is integrated for a certain period of time and used. FIG. 9 is a graph showing the relationship between the difference between the channel delays (delay) and the cumulative error. As graphically represented, when the cumulative error is calculated while changing the delay, the cumulative error is minimized at the time point of a certain delay. This shows that the transmission signal and the feedback signal are timed with each other at the certain delay. More specifically, the delay of the delay corrector part 423 is set to a certain value, which may be initially zero, and the cumulative error is calculated. As a result, one data point in the graph of FIG. 9 is determined. Thereafter, the delay is set to other values, and the operation of calculating the cumulative value is repeated. Thereby, the graph of FIG. 9 is obtained.

Figure 10:
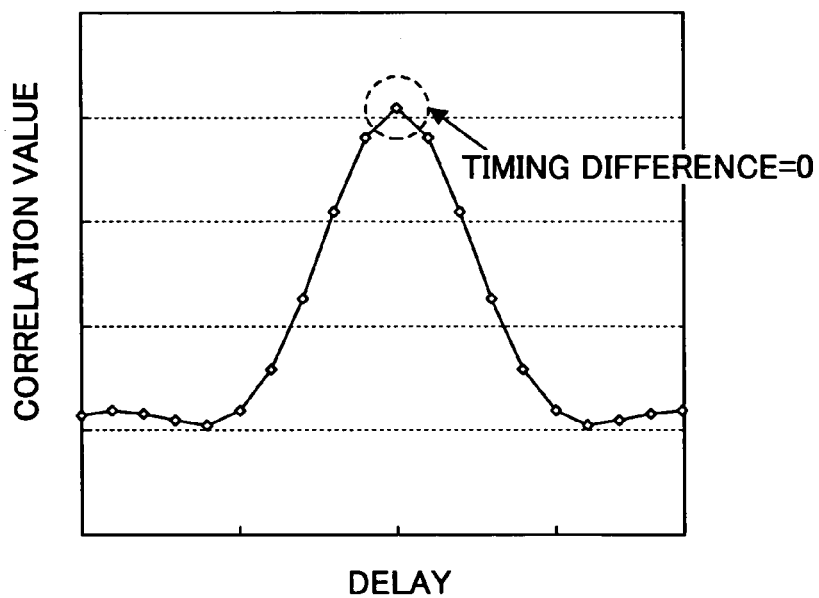
FIG. 10 is a graph showing the relationship between a correlation value and the delay according to the first embodiment of the present invention.

According to another method of measuring the delay, the correlation values of the transmission signal obtained directly from the node N and the feedback signal may be employed. In this case, the correlation peaks at a time point when the signals are timed with each other as shown in FIG. 10. Accordingly, the channel delay difference can be measured by finding a delay that causes the correlation to peak.

Second Embodiment

A description is given below of a second embodiment according to the present invention.

Figure 11:
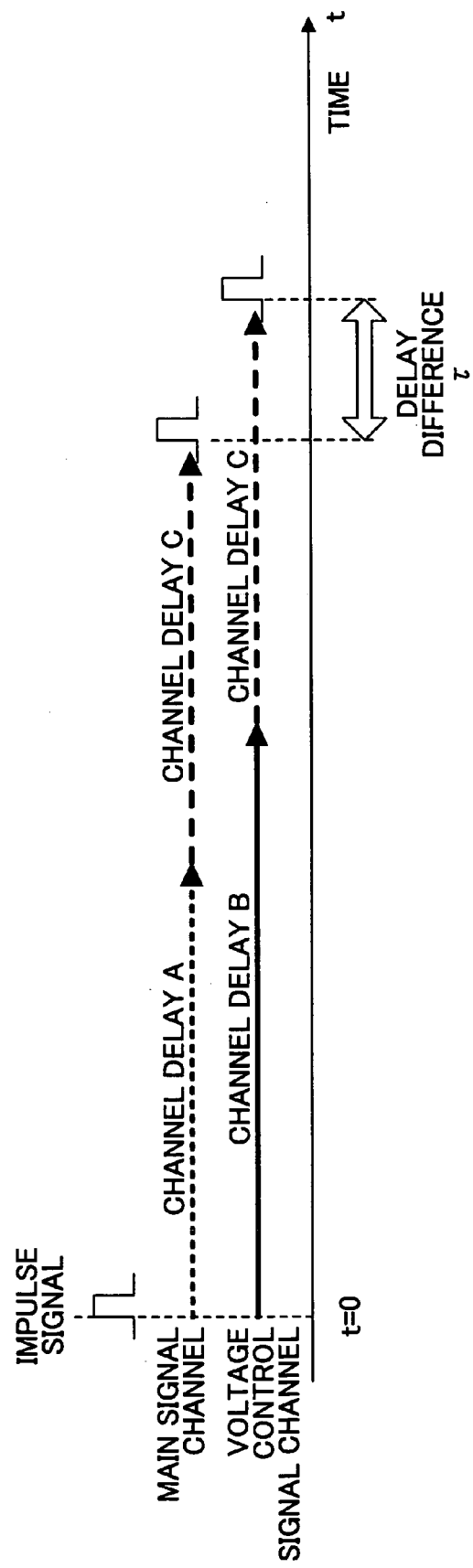
FIG. 11 is a diagram showing the case where a test signal (an impulse signal) is used as a transmission signal according to a second embodiment of the present invention.
Figure 12:
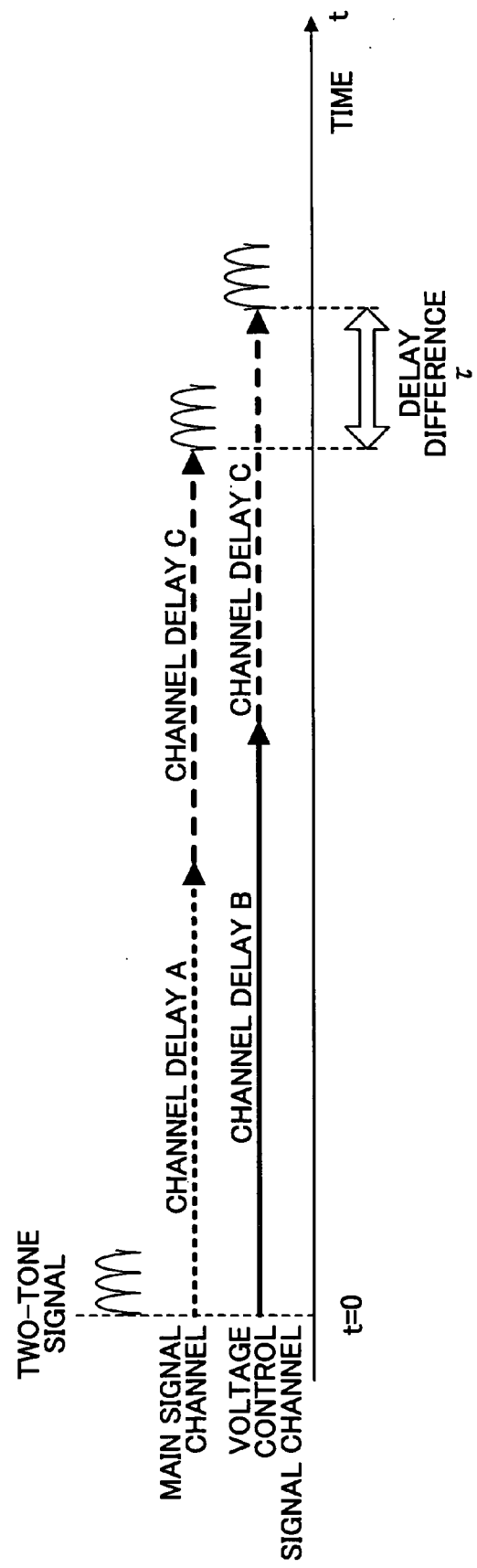
FIG. 12 is a diagram showing the case where a test signal (a two-tone signal) is used as the transmission signal according to the second embodiment of the present invention.

Any signal may be employed as a transmission signal used in measuring the channel delay. However, in terms of improving measurement accuracy, it is preferable to use a test signal having a special waveform. FIG. 11 shows the case where an impulse signal is used as a test signal. As graphically represented, the delay is determined by measuring the interval between pulses. Accordingly, the period in the case of sequentially transmitting pulses should be sufficiently longer than the delay. FIG. 12 shows the case where a two-tone signal is used as a test signal. In this case, the delay is determined by comparing the amplitudes of the two-tone signal. In terms of improving measurement accuracy, preferably, the two-tone signal has a low frequency. If the frequency is high, the waveform period becomes short so that it may be impossible to determine a large delay difference. Employment of test signals of such special waveforms is preferable in particular in sharpening a fall or peak appearing in the above-described cumulative error and correlation value. The test signal is not limited to the impulse signal and two-tone signal. Signals of various waveforms may be used as test signals.

Third Embodiment

Figure 13:
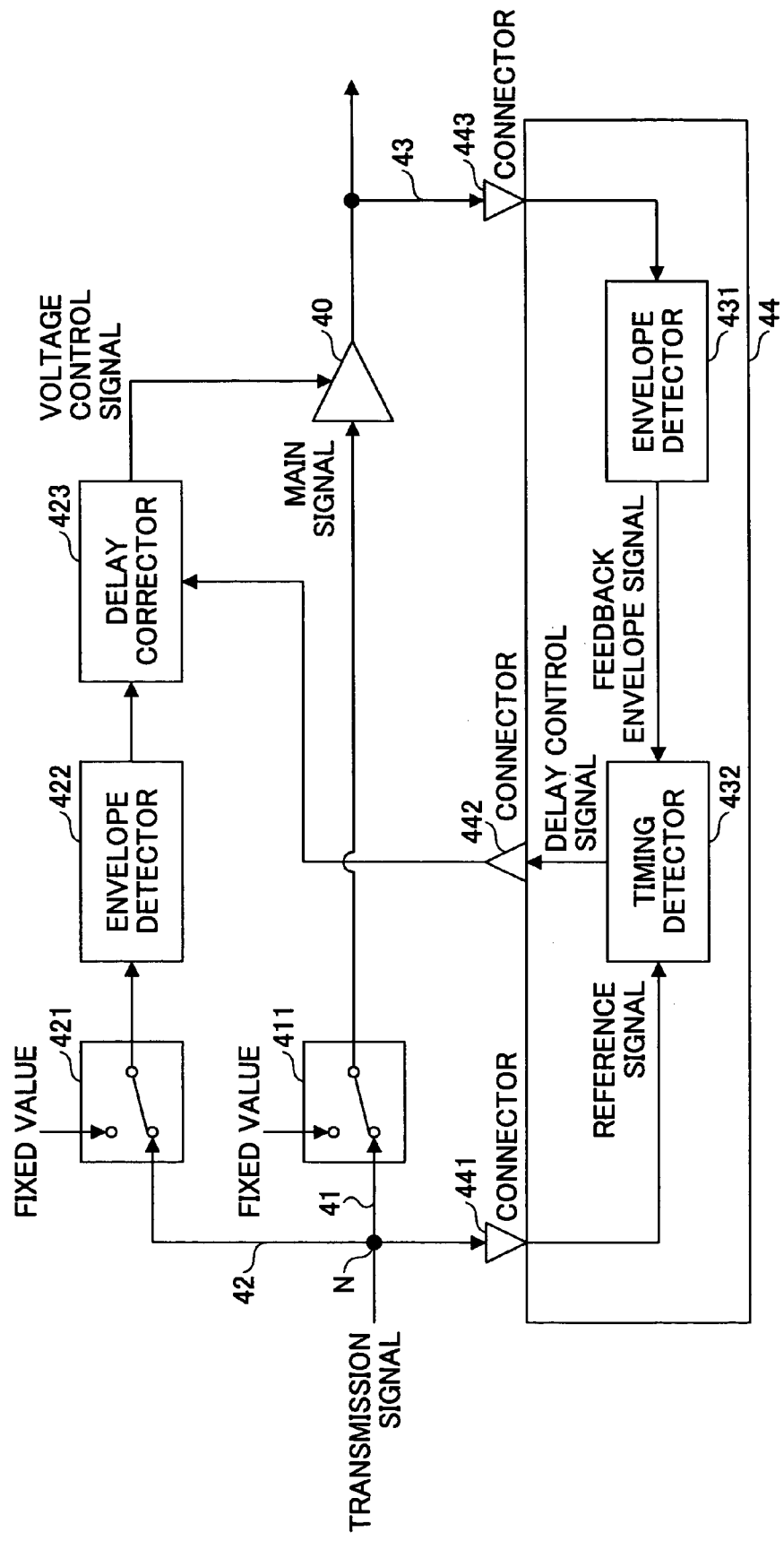
FIG. 13 is a block diagram showing a transmission part of a linear transmitter using a timing controller according to a third embodiment of the present invention.

FIG. 13 is a block diagram showing a transmission part of a linear transmitter using a timing controller according to a third embodiment of the present invention. According to this embodiment, a delay measurement part 44 including the envelope detector part 431 and the timing detector part 432 is removably attached to the main body of the linear transmitter through connectors 441, 442, and 443. This embodiment is preferable in terms of simplifying the configuration of the linear transmitter.

According to one embodiment of the present invention, the delay difference between a main signal channel and a control channel is measured by suitably switching each of a main signal switch to select one of an input signal and a signal representing a fixed value and a control signal switch to select one of the input signal and the signal representing the fixed value. A channel delay is controlled so as to cancel this delay difference. More specifically, the delay difference is determined by comparing a feedback signal in the case where the main signal switch selects the input signal and the control signal switch selects the signal representing the fixed value and a feedback signal in the case where the main signal switch selects the signal representing the fixed value and the control signal switch selects the input signal. As a result, the input signal (transmission signal) and a voltage control signal can be timed with each other with ease.

The fixed value is set to be greater than any input signal level. As a result, the output of an amplifier varies in accordance with the input signal (transmission signal) or varies in accordance with the voltage control signal, depending on the condition of each of the main signal switch and the control signal switch. Using this feature, it is possible to measure a channel delay difference with ease.

The channel delay difference may be measured by calculating the cumulative error between the input signal input to the main signal switch and the feedback signal. Alternatively, the channel delay difference may be measured by calculating the correlation between the input signal input to the main signal switch and the feedback signal. This makes it possible to facilitate measurement of the channel delay difference.

A part to detect the delay difference may be provided so as to be removable from the main body of a transmitter. As a result, it is possible to simplify the main body of the transmitter. This is advantageous in particular for mobile communications devices.

In a control mode, a test signal of a known waveform may be employed as the input signal. The test signal may be an impulse signal, a two-tone signal, etc. This makes it possible to improve the accuracy of measuring the channel delay difference.

According to one aspect of the present invention, it is possible to suitably control the timing between the input signal and the voltage control signal of an amplifier with ease in a linear transmitter that switches the supply voltage of the amplifier in accordance with the level of the input signal and outputs an output signal with little distortion with high amplification efficiency.

The present invention is not limited to the specifically disclosed embodiments, and variations and modifications may be made without departing from the scope of the present invention.

The present application is based on Japanese Priority Patent Application No. 2005-375677, filed on Dec. 27, 2005, the entire contents of which are hereby incorporated by reference.

What is claimed is:

1. A timing controller, comprising:
an amplifier part configured to amplify a first input signal in accordance with a control voltage, the first input signal being one of a transmission signal and a signal of a fixed value;
a detector part configured to detect envelope information from an output signal of the amplifier part;

a controller part configured to determine a delay difference from the transmission signal and the envelope information and transmit a timing control signal based on the delay difference; and a delay corrector part configured to correct a delay of a second input signal in accordance with the timing control signal, the second input signal being one of the transmission signal and a signal of a fixed value, wherein one of the first and second input signals employs the corresponding signal of the fixed value in a case of correcting the delay.

2. A mobile communications device, comprising:
the timing controller as set forth in claim 1.

3. A timing controller, comprising:

an amplifier part configured to amplify a transmission signal while controlling supply voltage to a power amplifier;

a generator part configured to generate a voltage control signal from envelope information of the transmission signal;

a main signal switch configured to select one of a transmission signal and a signal representing a fixed value, the main signal switch being provided in a main signal channel;

a control signal switch configured to select one of the transmission signal and a signal representing a fixed value, the control signal switch being provided in a control channel;

a delay detector part configured to detect a delay difference between the main signal channel and the control channel based on a feedback signal from the amplifier part; and a controller part configured to control a channel delay of at least one of the main signal channel and the control channel so as to cancel the delay difference, wherein each of the main signal switch and the control signal switch selects the transmission signal in a non-control mode, and one of the main signal switch and the control signal switch selects the transmission signal and another one of the main signal switch and the control signal switch selects the corresponding signal of the fixed value in a control mode.

4. The timing controller as claimed in claim 3, wherein the delay detector part determines the delay difference between the main signal channel and the control channel by comparing the feedback signal in a case where the main signal switch selects the transmission signal and the control signal switch selects the corresponding signal of the fixed value and the feedback signal in a case where the main signal switch selects the corresponding signal of the fixed value and the control signal switch selects the transmission signal.

5. The timing controller as claimed in claim 3, wherein each of the fixed values is greater than a level of an input signal.

6. The timing controller as claimed in claim 3, wherein the delay detector part comprises:

a part to calculate a cumulative error between the transmission signal input to the main signal switch and the feedback signal.

7. The timing controller as claimed in claim 3, wherein the delay detector part comprises:

a part to calculate correlation between the transmission signal input to the main signal switch and the feedback signal.

8. The timing controller as claimed in claim 2, wherein the delay detector part is removable from at least the amplifier part.

9. The timing controller as claimed in claim 3, wherein a test signal having a known waveform is used as the transmission signal in the control mode.

10. The timing controller as claimed in claim 9, wherein the test signal is an impulse signal.

11. The timing controller as claimed in claim 9, wherein the test signal is a two-tone signal.

12. A timing control method, comprising the steps of:
(a) amplifying a first input signal in accordance with a control voltage, the first input signal being one of a transmission signal and a signal of a fixed value;
(b) detecting envelope information from the amplified signal of said step (a);
(c) determining a delay difference from the transmission signal and the envelope information and transmitting a timing control signal based on the delay difference; and
(d) correcting a delay of a second input signal in accordance with the timing control signal, the second input signal being one of the transmission signal and a signal of a fixed value,
wherein one of the first and second input signals employs the corresponding signal of the fixed value in a case of correcting the delay.

13. A timing control method, comprising the steps of:
(a) providing one of a transmission signal and a signal representing a fixed value in a main signal channel and providing another one of the transmission signal and the signal representing the fixed value in a control channel;
(b) amplifying the one of the transmission signal and the signal representing the fixed value from the main signal channel in accordance with a voltage control signal from the control channel;
(c) providing the other one of the transmission signal and the signal representing the fixed value in the main signal channel and providing the one of the transmission signal and the signal representing the fixed value in the control channel;
(d) amplifying the other one of the transmission signal and the signal representing the fixed value from the main signal channel in accordance with the voltage control signal from the control channel;
(e) determining a delay difference between the main signal channel and the control channel based on the amplified one of the transmission signal and the signal representing the fixed value from the main signal channel and the amplified other one of the transmission signal and the signal representing the fixed value from the main signal channel; and
(f) controlling a channel delay of at least one of the main signal channel and the control channel so as to cancel the delay difference therebetween.

* * * * *